United States Patent [19]

Hoopman

[11] Patent Number: 4,839,227
[45] Date of Patent: Jun. 13, 1989

[54] RESILIENT ELECTRICALLY AND THERMALLY CONDUCTIVE FLEXIBLE COMPOSITE

[75] Inventor: Timothy L. Hoopman, Kinnikinnic Township, St. Croix County, Wis.

[73] Assignee: Minnesota Mining and Manufacturing Company, St. Paul, Minn.

[21] Appl. No.: 24,997

[22] Filed: Mar. 12, 1987

[51] Int. Cl.$^4$ ............................................. C09V 7/02
[52] U.S. Cl. ................................. 428/343; 428/164; 428/209; 428/344; 428/450; 428/458
[58] Field of Search ............... 428/209, 260, 262, 913, 428/148, 344, 164, 182, 379, 389, 450, 458, 901, 356, 156, 172, 343, 349, 376, 397, 399, 400; 174/97, 106 R, 106 D, 107, 117 PC, 117 A, 121 R

[56] References Cited

U.S. PATENT DOCUMENTS

| | | | |
|---|---|---|---|
| 3,497,383 | 2/1970 | Olyphant, Jr. et al. | 428/162 |
| 3,530,033 | 9/1970 | Hildebrandt | 428/164 |
| 4,191,800 | 3/1980 | Holtzman | 428/901 |
| 4,407,883 | 10/1983 | Newton | 428/901 |
| 4,503,112 | 3/1985 | Konicek | 428/901 |
| 4,540,620 | 9/1985 | Johnson et al. | 428/901 |
| 4,569,877 | 2/1986 | Tollefson et al. | 428/148 |
| 4,606,962 | 8/1986 | Reylek et al. | 428/148 |
| 4,609,586 | 9/1986 | Jensen et al. | 428/209 |
| 4,663,215 | 5/1987 | Dubuisson et al. | 428/209 |
| 4,671,984 | 6/1987 | Maeda et al. | 428/901 |

Primary Examiner—Ellis P. Robinson
Assistant Examiner—Donald J. Loney
Attorney, Agent, or Firm—Donald M. Sell; Walter N. Kirn; Adonis A. Neblett

[57] ABSTRACT

The invention provides a flexible composite comprising a resilient structured conductive member extending between opposite surfaces of the composite and a polymeric coating on each side of the conductive member to define therewith the opposite surfaces. The conductive member comprises a plurality of tapered elements extending to opposite surfaces of the composite. The conductive member thereby provides a conductive pathway through the composite which is adapted to compress and return towards its original shape as a force is applied and decreased.

9 Claims, 1 Drawing Sheet

RESILIENT ELECTRICALLY AND THERMALLY CONDUCTIVE FLEXIBLE COMPOSITE

FIELD OF THE INVENTION

The present invention relates to a flexible composite capable of joining two members electrically and thermally, particularly an adhesive composite to connect a semiconductor die or chip to an electrically and thermally conductive substrate.

BACKGROUND ART

Semiconductors, such as integrated circuits, are formed on wafers which are then cut into dice or chips that individually may be mounted on substrates. Typically, the substrate is electrically and thermally conductive, with mounting providing both good electrical and good thermal conductivity between the die and the substrate.

Known methods of attaching a die to an electrically and thermally conductive substrate include employing a solder or eutectic alloy such as a gold-silicon alloy, employing die-attach adhesive pastes consisting of a heat-curing epoxy resin composition filled with fine metal particles; and employing an electrically and thermally conductive adhesive transfer tape which comprises a flexible, carrier web to which is lightly adhered an adhesive containing fine metal particles or a deformable metal foil. See, for example, U.S. Pat. No. 4,606,962. Precious metal eutectic alloy connections may be prohibitively expensive and particle or foil adhesive connections experience problems discussed below.

Semiconductor chips are used in a myriad of applications ranging from, for example, the dash board of an automobile, to pocket calculators, to space vehicles. In many of these various applications temperatures can range from well below 0° C. to well above 150° C. In the case of prior art adhesives containing particles or foils, as temperatures vary the adhesive used to connect the chip to the substrate expands and contracts. The metal particles or foil used to make electrical connection between the chip and substrate also expands and contracts, but at a greatly different rate from that of the adhesives typically used. Therefore, as temperature changes, electrical connection can be lost as the adhesive expands or contracts at a rate different from that of the metal. This can result in the failure of the part to which the chip was connected, in some cases with drastic consequences. Similarly, failure can occur with the use of solder as differential expansion causes the chip to crack.

There are other various applications where a flexible composite capable of joining two members electrically and thermally throughout extremes in temperature is required. Examples of these applications include conductive gaskets and floor mats which eliminate static.

It is therefore highly desirable to provide a flexible composite which does not experience a loss of electrical or thermal connection when exposed to extreme temperature variations, by providing a conductive flexible composite which includes a resilient structured conductive layer.

DISCLOSURE OF THE INVENTION

The above-discussed difficulties of prior attempts at joining two members electrically and thermally throughout extreme temperature variations are avoided in the present invention by providing a flexible composite comprising:

A resilient structured conductive member extending between opposite surfaces of the composite and a polymeric coating on each side of the conductive member to define therewith the opposite surfaces. The conductive member includes a plurality of tapered elements extending to opposite surfaces of the composite, defining oppositely disposed structured surfaces defined by longitudinally extending ridges and grooves filled with the polymeric coating material to form a composite of substantially uniform thickness. Tapered is herein defined as meaning becoming narrower at one end. The conductive member thereby provides a conductive pathway through the composite. The structure of the conductive layer is adapted to compress and return towards its original shape as a force is applied and decreased.

One aspect of the present invention provides a flexible composite wherein the plurality of tapered elements each include a first and second pair of inclined surfaces and a pair of resilient connecting members; the first pair of inclined surfaces joining to form an acute angle therebetween and are adapted to protrude through the top surface of the composite; one pair of resilient connecting members lying substantially parallel to the surfaces each extending in opposite directions from the base of the first pair of inclined surfaces with the second pair of inclined surfaces each extending downward from the connecting elements.

The length of each repeating unit or the distance between ridges of a typical structured surface of the present invention is between 0.015 mm and 0.25 mm. The height of the structured surface is typically between 0.01 mm and 0.10 mm.

The polymeric coating may comprise, for example, a single adhesive or different adhesives. Examples of useful adhesives include heat-tackified adhesives, pressure-sensitive adhesives, thermo-set adhesives, and thermo-plastic adhesives. Other useful polymeric coatings include ionomeric resins, polyester resins and others.

The resilient structured conductive member of the present invention typically comprises at least one metallic material, however the resilient member can be comprised of two or more different metals.

The flexible composite of the present invention can be used to attach a die to a thermally and/or electrically conductive substrate, for example, by (a) bonding to a surface of a semiconductor wafer the flexible composite of the present invention
(b) cutting the wafer and composite layer into individual composite-bearing dice; and
(c) bonding the composite-bearing dice to a thermally and electrically conductive substrate.

DETAILED DESCRIPTION

Figure 1:
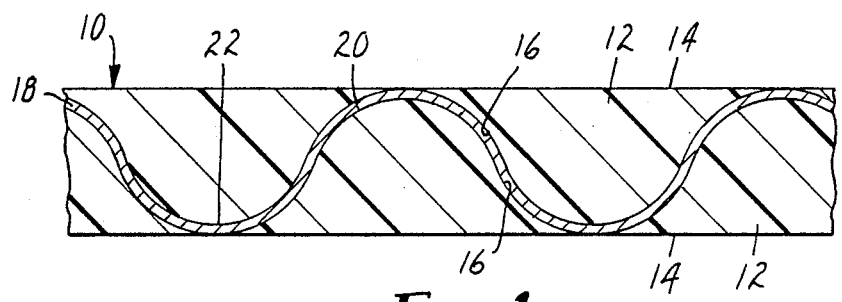
FIG. 1 is a schematic transverse cross-section of an embodiment of a resilient flexible composite of the present invention.

The resilient conductive flexible composite 10 of FIG. 1 comprises a pair of polymeric coatings 12 each having outer surfaces 14 and inner surfaces 16. Lying between inner surfaces 16 is a resilient structured member 18 which has alternating ridges 20 and grooves 22.

Figure 2:
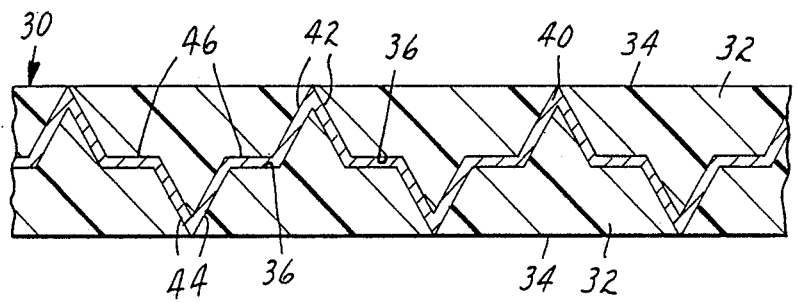
FIG. 2 is a schematic transverse cross-section of a second embodiment of a resilient flexible composite of the present invention.

In FIG. 2 there is shown a resilient conductive flexible composite 30 which comprises a pair of polymeric coatings 32 each having outer surfaces 34 and inner surfaces 36. Lying between inner surfaces 36 is a resilient structured member 40. Member 40 includes a plurality of repeating units each unit having a first pair of inclined surfaces 42 joined at their apex, a second pair of inclined surfaces 44, and a pair of substantially horizontal resilient connecting members 46. The first pair of inclined surfaces 42 join to form an acute angle $\alpha$ therebetween. Each of the second pair of inclined surfaces 44 join with a second inclined surface 44 of an adjacent repeating unit to form an angle $\beta$ therebetween.

Each of the pair of resilient connecting members 46 extend between a first inclined surface 42 and a second inclined surface 44. The combination of the first and second pairs of inclined surfaces 42 and 44, and the pair of resilient connecting elements 46 the totality of which form each repeating unit, form a resilient structure which compresses when a force is applied and returns towards its original position as the force is decreased.

Figure 3:
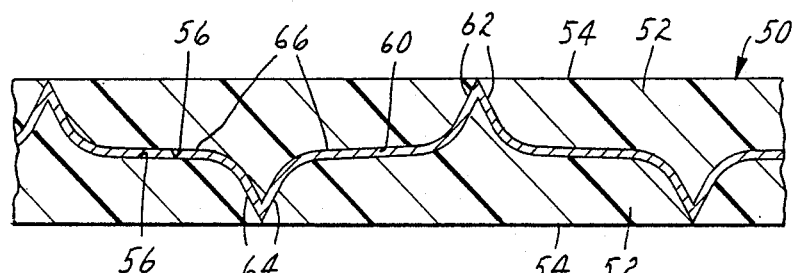
FIG. 3 is a schematic transverse cross-section of a third embodiment of a resilient flexible composite of the present invention.

An additional resilient conductive flexible composite 50 is shown in FIG. 3. The composite 50 comprises a pair of polymeric coatings 52 each having an outer surface 54 and an inner surface 56 with a resilient structured member 60 lying between the inner surfaces 56. Member 60 includes a plurality of repeating units each unit having a first pair of inclined surfaces 62 joined at their apex, a second pair of inclined surfaces 64, and a pair of substantially horizontal resilient connecting members 66. The first pair of inclined surfaces 62, join to form an acute angle, gamma, therebetween, each of the second pair of inclined surfaces 64 join with a second inclined surface 64 of an adjacent unit to form an angle, delta, therebetween. Each of the pair of resilient connecting members 66 extend between a first inclined surface 62 and a second inclined surface 64. The junctures between the members 66 and the inclined surfaces 62, 64 are arcuate to more evenly distribute the stress along the juncture when a force is applied to the composite 50. Member 60 compresses when a force is applied and returns towards its original position as the force is decreased.

A flexible composite having the structured member 40 shown in FIG. 2 is further described in the non-limiting example below. A composite having the structure shown in FIG. 1 or 3 could be made by following a similar procedure.

EXAMPLE 1

An embossing plate was generated by diamond cutting the negative of the desired surface geometry of FIG. 2 into a copper plate. This geometry is referred to as the 4.5 mil stepped-V. The center-to-center distance between the juncture of surfaces 42 was 0.0045 inch. The total height of the structure from the juncture of 42 and the juncture of 44 was 0.0015 inch. The angles $\alpha$ and $\beta$ were each 45°. After cutting, the copper plate was given a thin (30-50 micro-inch) plating of electroless nickel for corrosion protection. This textured plate was then used in a heated platen press to emboss a 0.005 inch thick polyethylene film. The embossing conditions were 250° F. and 1000 PSI for a 30 second duration. The thus textured surface of the polyethylene film was then metalized with silver using conventional vapor deposition techniques to make the surface conductive. Then the conductive, textured surface was plated with nickel to a thickness of 0.0002 inch in an electrolytic nickel bath.

An epoxy adhesive system described in copending application attorney docket 41919 USA 8A, filed on even date, was made by mixing together 25 parts of PKHC, a phenoxy resin from the Union Carbide Corporation; 52 parts of "Quatrex" 1010, a diglycidyl ether of Bisphenol A epoxy resin from the Dow Chemical Company; 23 parts of 9,9-bis(3-methyl-4-aminophenyl)-fluorene, a curative, and four parts per hundred of the above resins of the triflic acid half salt of 2-ethyl-4-methylimidazole. The constituents were stirred to a uniform paste of 50% solids by weight in methyl ethyl ketone. The fluorene-amine curative was prepared for dispersion in this epoxy resin system by jet milling to a mean particle size of $\leq 5$ $\mu$m.

The epoxy adhesive paste lwas coated onto the nickel surface of the aforementioned nickel-silver/polyethylene film. The coating was applied at room temperature, followed by air drying for 30 minutes and one minute drying at 80° C. in a forced air oven. The coating was accomplished on a knife coater at 2 mils above the peaks 42 of the stepped-V design of the nickel plating, resulting in a dry coating approximating the height of the stepped-V's.

The coated nickel structure was next separated from the embossed polyethylene film by peeling the polyethylene from the metallization at an angle of greater than 90°. The uncoated side of the nickel metallization was then coated in a manner identical to that of the first side with the epoxy adhesive system, and dried in a similar manner.

The adhesive-metal-adhesive composite was then applied to an aluminized silicon wafer by heating the wafer to 80°–100° C. on a hotplate surface, then applying the composite using a 2 mil thick sheet of Teflon as a release liner, both beneath the wafer and above the composite adhesive film. Pressure was applied with a rubber roller to exclude air bubbles in the wafer/adhesive interface and the thus-laminated structure was removed from the hot surface after about one minute exposure to the elevated temperature.

Excess adhesive composite was trimmed from the edges of the wafer with a sharp blade, and the adhesive composite surface of the laminate applied to a frame-mounted blue vinyl wafer dicing film (Semiconductor Equipment Corp. Part. No. 18–74). Thus mounted, the wafer and adhesive were then cut into the individual 1.3 mm$\times$1.3 mm dice using a Disco Abrasive Systems DAD-2H/5 wafer dicing saw. Individual dice were removed from the wafer sawing film and bonded to a Pd-Ag bond pad on an alumina substrate. Bonding conditions were 275° C. and 0.98 newtons force for a duration of 10 seconds. The resulting bonds exhibited tyical resistances of 1 milliohm and shear strengths of 4000 PSI.

This resistance is comparable to or better than commercially available adhesive materials. Solders, such as gold, can have resistances on the order of 0.001 milliohn. However, solder bonds cracks, are extremely expensive and hard to handle. The MIL-883C shear strength standard for a 0.05" by 0.05" die is 1760 PSI at room temperature.

The described composite of Example 1 was subjected to exposure at 85° C., 85% relative humidity for in excess of 1000 hours to determine its stability under these conditions. Four-wire resistance measurements conducted over the period of the test indicate no significant degradation of contact resistance, a measure of adhesive degradation.

Dice bonded with the adhesive composite of Example 1 were exposed to thermal cycling over a range of from −65° C. to 150° C. for a period in excess of 1000 hours, and exhibited no significant degradation of performance as measured by four-wire resistance studies throughout this period. This is a measure of the composites resiliency throughout great ranges of temperature. A conventional epoxy paste die-attach adhesive (Epo-Tek H20E, from Epoxy Technology Inc.) was subjected to thermal cycling over a range of from −65° C. to 150° C. for a period of over 1000 hours. The resistance of the bond increased substantially during this period.

What is claimed is:

1. A flexible composite capable of joining and maintaining two members in electrical and thermal contact throughout wide temperature fluctuations comprising:
   a continuous resilient structured conductive member extending the length of the composite between opposite surfaces of said composite and a polymeric coating on each side of said conductive member to define therewith said opposite surfaces, wherein said conductive member includes a plurality of tapered elements extending to opposite surfaces of said composite, defining oppositely disposed structured surfaces defined by longitudinally extending ridges and grooves filled with said polymeric coating to form a composite of substantially uniform thickness, wherein the structure of said conductive member is adapted to compress and return towards its original shape as a force is applied and decreased, thereby enabling the conductive member to follow the expansion and contraction of the polymeric coating due to temperature fluctuations.

2. The flexible composite of claim 1 wherein said plurality of tapered elements include resilient connecting members.

3. The flexible composite of claim 2 wherein said plurality of tapered elements each include
   a first and second pair of inclined surfaces and a pair of resilient connecting members; said first pair of inclined surfaces joining at their apex to form an acute angle therebetween and adapted to protrude through the top surface of said composite; said pair of resilient connecting members lying substantially parallel to said surfaces each extending in opposite directions from the base of said first pair of inclined surfaces with said second pair of inclined surfaces each extending downward from said connecting members.

4. The flexible composite of claim 1 wherein said polymeric coating comprises at least one adhesive selected from the group consisting of heat-tackified adhesives, pressure-sensitive adhesives, and thermo-set adhesives.

5. The flexible composite of claim 1 wherein said polymeric coating on one side of said conductive member and said polymeric coating on the other side of said conductive member are selected from the group consisting of heat-tackified adhesives, pressure-sensitive adhesives, and thermo-set adhesives and are different from each other.

6. The flexible composite of claim 3 wherein the length of each tapered element is between 0.015 mm and 0.25 mm.

7. The flexible composite of claim 3 wherein the height of each tapered element is between 0.010 mm and 0.25 mm.

8. The flexible composite of claim 1 wherein said structured conductive member comprises at least one metallic surface.

9. The flexible composite of claim 8 wherein said structured conductive member comprises two metallic surfaces of different metals.

* * * * *